(12) United States Patent
Tanaka (10) Patent No.: US 11,485,138 B2
(45) Date of Patent: Nov. 1, 2022

(54) LIQUID DISCHARGE HEAD

(71) Applicant: Brother Kogyo Kabushiki Kaisha, Aichi-Ken (JP)

(72) Inventor: Taiki Tanaka, Yokkaichi (JP)

(73) Assignee: Brother Kogyo Kabushiki Kaisha, Nagoya (JP)

(*) Notice: Subject to any disclaimer, the term of this patent is extended or adjusted under 35 U.S.C. 154(b) by 0 days.

(21) Appl. No.: 17/232,452

(22) Filed: Apr. 16, 2021

(65) Prior Publication Data

US 2021/0331473 A1 Oct. 28, 2021

(30) Foreign Application Priority Data

Apr. 22, 2020 (JP) .............................. JP2020-076267

(51) Int. Cl.
*B41J 2/14* (2006.01)
*H01L 41/09* (2006.01)
*B41J 2/16* (2006.01)

(52) U.S. Cl.
CPC ......... *B41J 2/14233* (2013.01); *B41J 2/1404* (2013.01); *B41J 2/1626* (2013.01); *H01L 41/0973* (2013.01)

(58) Field of Classification Search
None
See application file for complete search history.

(56) References Cited

U.S. PATENT DOCUMENTS

| | | | | |
|---|---|---|---|---|
| 5,988,800 A | * | 11/1999 | Ema | ........................ C03C 15/00 347/70 |
| 2003/0222947 A1 | * | 12/2003 | Tomozawa | .......... H01L 41/0815 347/68 |
| 2018/0287046 A1 | | 10/2018 | Hirai et al. | |

FOREIGN PATENT DOCUMENTS

JP          2018-167576 A          11/2018

* cited by examiner

*Primary Examiner* — Erica S Lin
(74) *Attorney, Agent, or Firm* — Banner & Witcoff, Ltd.

(57) ABSTRACT

There is provided a liquid discharge head, including: a channel unit; a vibration film; and piezoelectric elements. Pressure chambers form pressure chamber pairs arranged in a second direction. Each of the pressure chamber pairs includes a first pressure chamber and a second pressure chamber that communicate with an identical nozzle via a communication channel Rigidity of a first partition wall separating the first pressure chamber from the second pressure chamber, the first and second pressure chambers being included in each of the pressure chamber pairs, is different from rigidity of a second partition wall separating the first pressure chamber from the second pressure chamber, the first and second pressure chambers being adjacent to each other in the second direction and included in different pressure chamber pairs included in the pressure chamber pairs.

9 Claims, 9 Drawing Sheets

LIQUID DISCHARGE HEAD

CROSS REFERENCE TO RELATED APPLICATION

The present application claims priority from Japanese Patent Application No. 2020-076267 filed on Apr. 22, 2020, the disclosure of which is incorporated herein by reference in its entirety.

BACKGROUND

Field of the Invention

The present disclosure relates to a liquid discharge head configured to discharge liquid from nozzles.

Description of the Related Art

As a liquid discharge head configured to discharge liquid from nozzles, there is conventionally known a recording head configured to jet ink from nozzles. In the conventionally known recording head, an elastic film covering pressure chambers is disposed on an upper surface of a pressure chamber forming substrate in which a row of pressure chambers are formed. Piezoelectric elements, by which discharge energy for discharging ink from respective nozzles that communicate with respective pressure chambers is applied to the liquid in the pressure chambers, are arranged in a portion included in an upper surface of the elastic film and overlapping in an up-down direction with each pressure chamber. A protective substrate covering the piezoelectric elements is disposed on the upper surface of the elastic film, and the piezoelectric elements are accommodated in a space formed by the protective substrate.

SUMMARY

When ink viscosity is high, discharge energy required for discharging ink from nozzles is large. However, in the liquid discharge head, there is a demand for a decrease in size of pressure chambers in view of high-density nozzle arrangement and a downsized apparatus. It is assumed that the size of the pressure chamber is small. In this case, when an apparatus is configured so that one nozzle communicates with one pressure chamber, sufficient discharge energy may not be applied to the ink in the pressure chamber. Thus, the inventor of the present disclosure has considered that discharge energy to be applied is increased by allowing one nozzle to communicate with two adjacent pressure chambers and driving two piezoelectric elements that correspond to the two pressure chambers at the same time.

However, in the above configuration, since two piezoelectric elements are driven at the same time, parts of the electric film overlapping with the two piezoelectric elements are deformed at the same time. This increases the effect of crosstalk. When the crosstalk is caused, deformation of a part of a vibration film overlapping with a certain pressure chamber affects a part of the vibration film overlapping with another pressure chamber. This changes discharge characteristics of the liquid in a nozzle communicating with the another pressure chamber.

An object of the present disclosure is to provide a liquid discharge head that can apply sufficient discharge energy to liquid and inhibit the effect of crosstalk as much as possible.

According to an aspect of the present disclosure, there is provided a liquid discharge head, including: a channel unit having a liquid channel that includes a plurality of pressure chambers; a vibration film disposed at a first side in a first direction of the channel unit to cover the pressure chambers; and a plurality of piezoelectric elements disposed at the first side in the first direction of the vibration film, the piezoelectric elements overlapping in the first direction with the pressure chambers. The pressure chambers form a plurality of pressure chamber pairs arranged in a second direction orthogonal to the first direction. The pressure chamber pairs include a plurality of first pressure chambers and a plurality of second pressure chambers. Each of the second pressure chambers are disposed at a first side in the second direction of the corresponding one of the first pressure chambers. The liquid channel includes a plurality of nozzles respectively corresponding to the pressure chamber pairs, and a plurality of communication channels respectively corresponding to the pressure chamber pairs. Each of the communication channels allow one of the first pressure chambers, one of the second pressure chambers, and one of the nozzles to communicate with each other. In the channel unit, rigidity of a first partition wall separating one of the first pressure chambers from one of the second pressure chambers, the one of the first pressure chambers and the one of the second pressure chambers included in each of the pressure chamber pairs, is different from rigidity of a second partition wall separating one of the first pressure chambers from one of the second pressure chambers, the one of the first pressure chambers and the one of the second pressure chambers being adjacent to each other in the second direction and included in different pressure chamber pairs included in the pressure chamber pairs.

DESCRIPTION OF THE EMBODIMENTS

An embodiment of the present disclosure is explained below.

Printer 100

Figure 1:
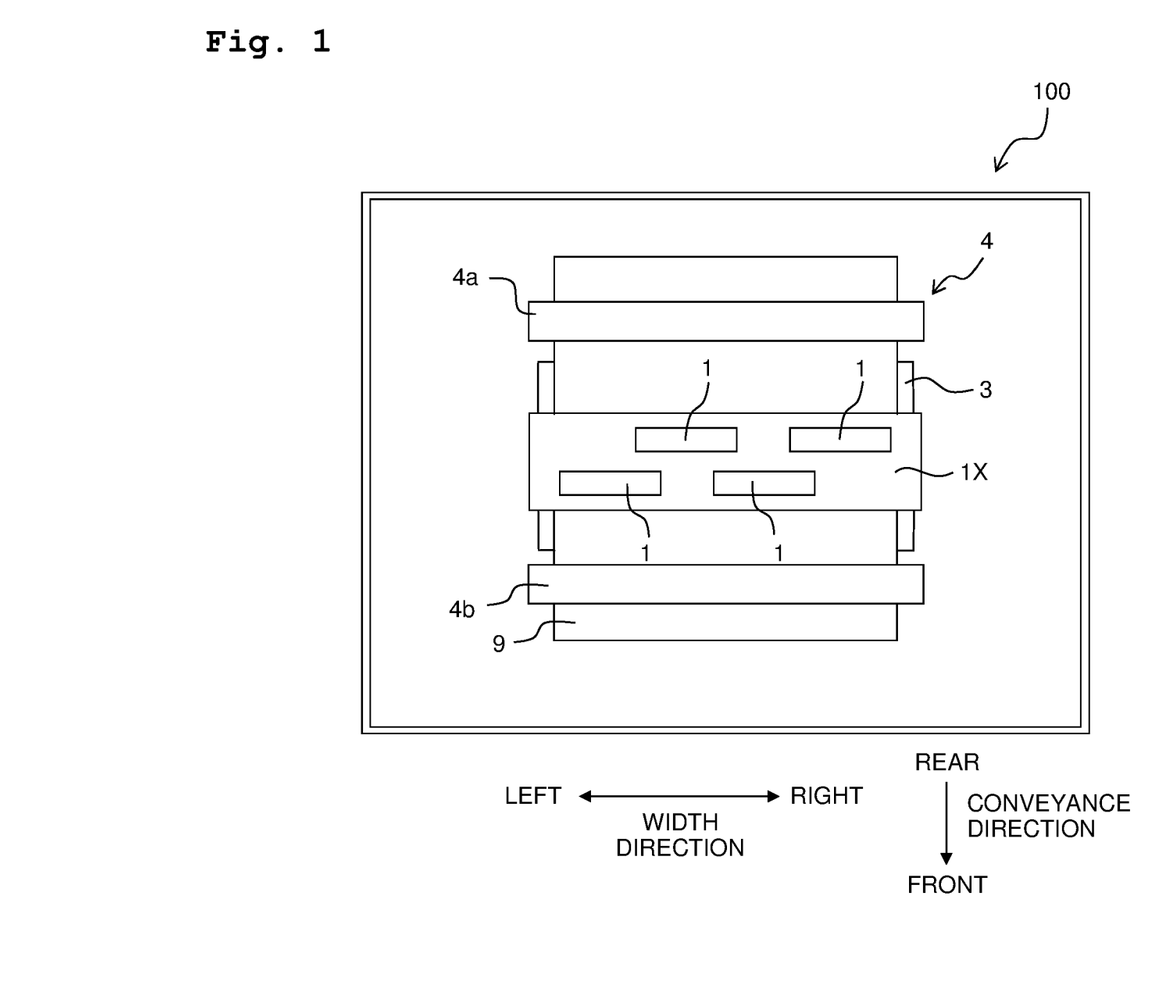
FIG. 1 is a plan view of a printer provided with ink-jet heads.

As depicted in FIG. 1, a printer 100 of this embodiment includes a head unit 1x including four ink-jet heads 1 (a "liquid discharge head" of the present disclosure), a platen 3, and a conveyor 4.

The head unit 1x is long in a horizontal width direction (a "second direction" of the present disclosure). The head unit 1x is a so-called line head that discharges ink from nozzles 22 (see FIGS. 2 to 4) to a sheet 9 with a position of the head unit 1x being fixed. The four ink-jet heads 1 are long in the width direction. Of the four ink-jet heads 1, two ink-jet heads 1 are arranged in the width direction. Remaining two ink-jet heads 1 are arranged in the width direction at positions shifted in a horizontal conveyance direction, which is orthogonal to the width direction, from the two ink-jet heads 1. Of the four ink-jet heads 1, the two ink-jet heads 1 arranged in the width direction are shifted in the width direction from the remaining two ink-jet heads 1 arranged in the width direction.

In the following explanation, right and left sides in the width direction are defined as indicated in FIG. 1. Further, front and rear sides in the conveyance direction are defined as indicated in FIG. 1.

The platen 3 is disposed below the head unit 1x to face the nozzles 22 of the four ink-jet heads 1. The sheet 9 is placed on an upper surface of the platen 3.

The conveyor 4 includes two roller pairs 4a and 4b arranged to interpose the platen 3 therebetween in the conveyance direction. The roller pairs 4a and 4b rotate while nipping the sheet 9, and conveys the sheet 9 in the conveyance direction.

Ink-Jet Head 1

A configuration of the ink-jet head 1 is explained below. As depicted in FIGS. 2 to 5, the ink-jet head 1 includes a channel unit 11, a piezoelectric actuator 12, a protective member 13, a manifold substrate 14, and a trace substrate 18.

Figure 3:
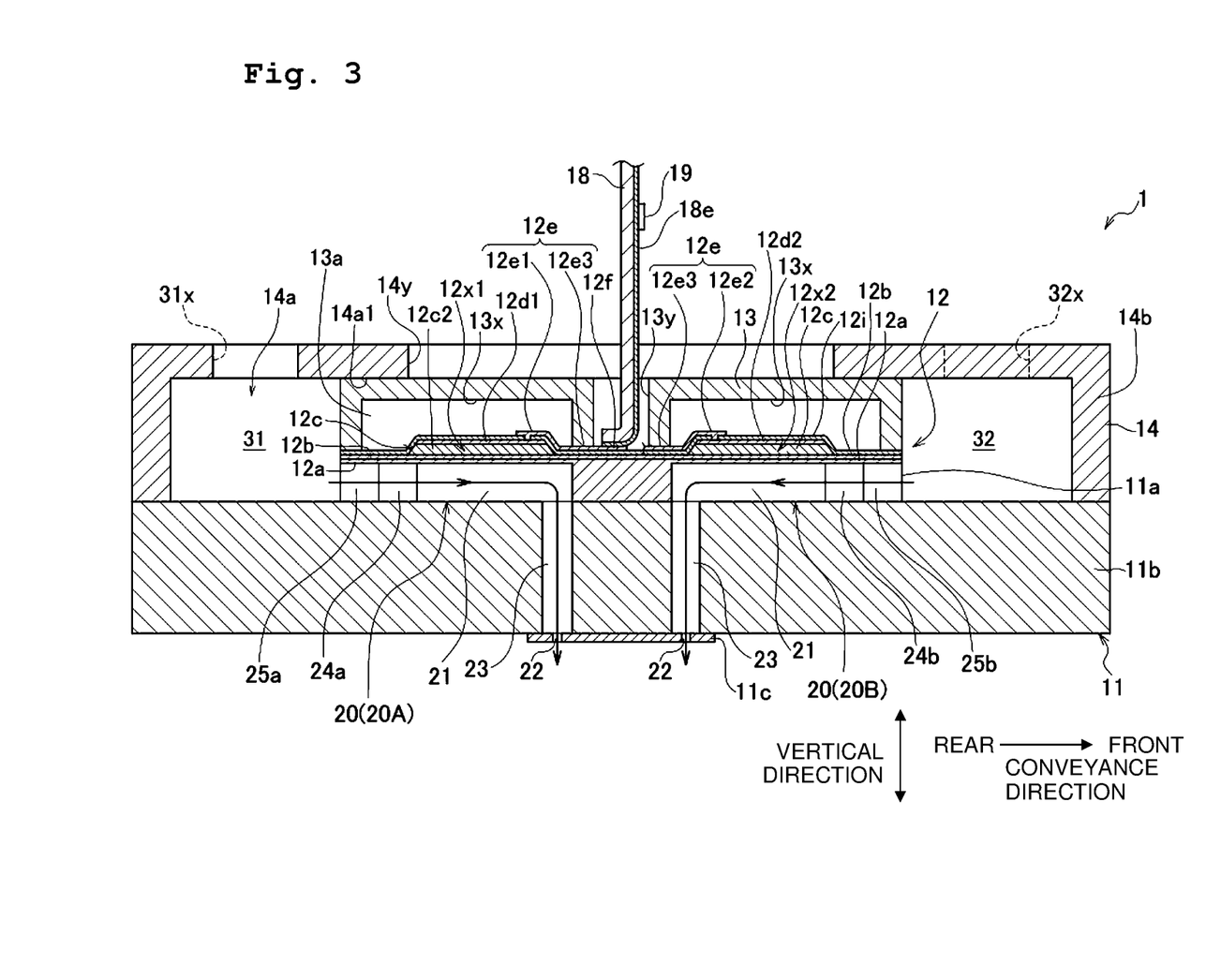
FIG. 3 is a cross-sectional view of the ink-jet head taken along a line in FIG. 2.

The channel unit 11 is configured by stacking three plates 11a to 11c in a vertical direction (a "first direction" of the present disclosure"). The three plates 11a to 11c adhere to each other by adhesive. The plates 11a to 11c are formed, for example, by resin or metal such as stainless steel. Individual channels 20 are formed in the plates 11a to 11c. In this embodiment, an upper side in the vertical direction corresponds to a "first side in the first direction" of the present disclosure.

Figure 2:
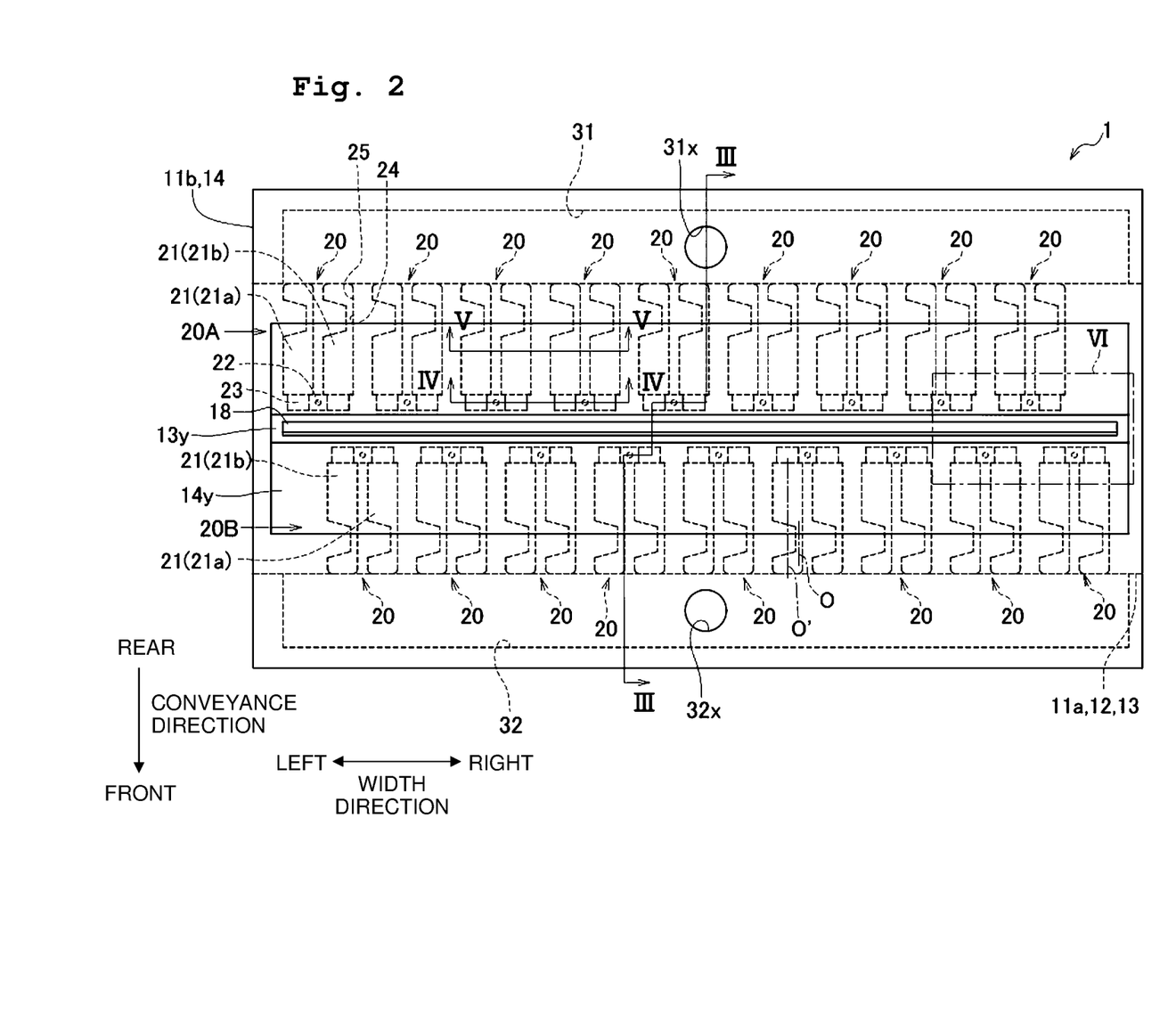
FIG. 2 is a plan view of the ink-jet head.

As depicted in FIG. 2, the individual channels 20 form individual channel rows 20A and 20B. Each of the individual channel rows 20A and 20B includes the individual channels 20 arranged in the width direction. The individual channel rows 20A and 20B are arranged in the conveyance direction at an interval. The individual channel row 20B is positioned at the front side of the individual channel row 20A in the conveyance direction. It is assumed that an interval in the width direction between the individual channels 20 in each of the individual channel rows 20A and 20B is P. In this case, the individual channels 20 forming the individual channel row 20A are shifted in the width direction from the individual channels 20 forming the individual channel row 20B by a length of P/2.

As depicted in FIG. 2, each individual channel 20 includes two pressure chambers 21 (a first pressure chamber 21a and a second pressure chamber 21b), one of the nozzles 22, a communication channel 23, and two narrow channels 24, and two wide channels 25.

The pressure chamber 21 has a substantially rectangular shape that is long in the conveyance direction as viewed in the vertical direction. The second pressure chamber 21b is adjacent to a first side in the width direction of the first pressure chamber 21a. In the individual channels 20 forming the individual channel row 20A, the first side in the width direction corresponds to the right side. In the individual channels 20 forming the individual channel row 20B, the first side in the width direction corresponds to the left side. In the following, the left side in the individual channels 20 forming the individual channel row 20A and the right side in the individual channels 20 forming the individual channel row 20B correspond to a second side in the width direction.

An end at a first side in the conveyance direction of the pressure chamber 21 is connected to the communication channel 23, and an end at a second side in the conveyance direction of the pressure chamber 21 is connected to the narrow channel 24. In the individual channel row 20A, the first side in the conveyance direction corresponds to the front side in the conveyance direction. In the individual channel row 20B, the first side in the conveyance direction corresponds to the rear side in the conveyance direction. In the individual channel row 20A, the second side in the conveyance direction corresponds to the rear side in the conveyance direction. In the individual channel row 20B, the second side in the conveyance direction corresponds to the front side in the conveyance direction.

As depicted in FIG. 2, the narrow channel 24 has a width narrower than the pressure chamber 21 (a length in the width direction of the narrow channel 24 is shorter than that of the pressure chamber 21). The narrow channel 24 functions as a throttle. A center line O in the width direction of the narrow channel 24 is positioned at the right side in the width direction with respect to a center line O' in the width direction of the pressure chamber 21 corresponding thereto.

An end at the second side in the conveyance direction of the narrow channel 24 is connected to the wide channel 25. A width of the wide channel 25 (length in the width direction of the wide channel 25) is substantially the same as the width of the pressure chamber 21. A center line in the width direction of the wide channel 25 is coincident with the center line O' in the width direction of the pressure chamber 21 corresponding thereto.

As depicted in FIG. 3, the pressure chambers 21, the narrow channels 24, and the wide channels 25 are formed in the plate 11a ("pressure chamber member" of the present disclosure") by wet etching. The pressure chambers 21, the narrow channels 24, and the wide channels 25 are formed by recesses that are opened in a lower surface of the plate 11a.

Each part of the plate 11a between the first pressure chamber 21a and the second pressure chamber 21b adjacent to the first side in the width direction of the first pressure chamber 21a is a first partition wall 11a1 that separates the first pressure chamber 21a from the second pressure chamber 21b. Further, each part of the plate 11a between the first pressure chamber 21a and the second pressure chamber 21b adjacent to the second side in the width direction of the first pressure chamber 21a is a second partition wall 11a2 that separates the first pressure chamber 21a from the second pressure chamber 21b. A width W2 (length in the width direction) of the second partition wall 11a2 is larger than a width W1 of the first partition wall 11a1. For example, the width W1 is approximately 10 μm and the width W2 is approximately 18 μm. Thus, rigidity of the second partition walls 11a2 is higher than rigidity of the first partition walls 11a1.

The nozzles 22 are formed by through holes formed in the plate 11c ("nozzle member" of the present disclosure) by laser processing or the like. The nozzle 22 is positioned at a center between the first pressure chamber 21a and the second pressure chamber 21b in the width direction. The nozzle 22 overlaps with the first partition wall 11a1 in the vertical direction.

Figure 4:
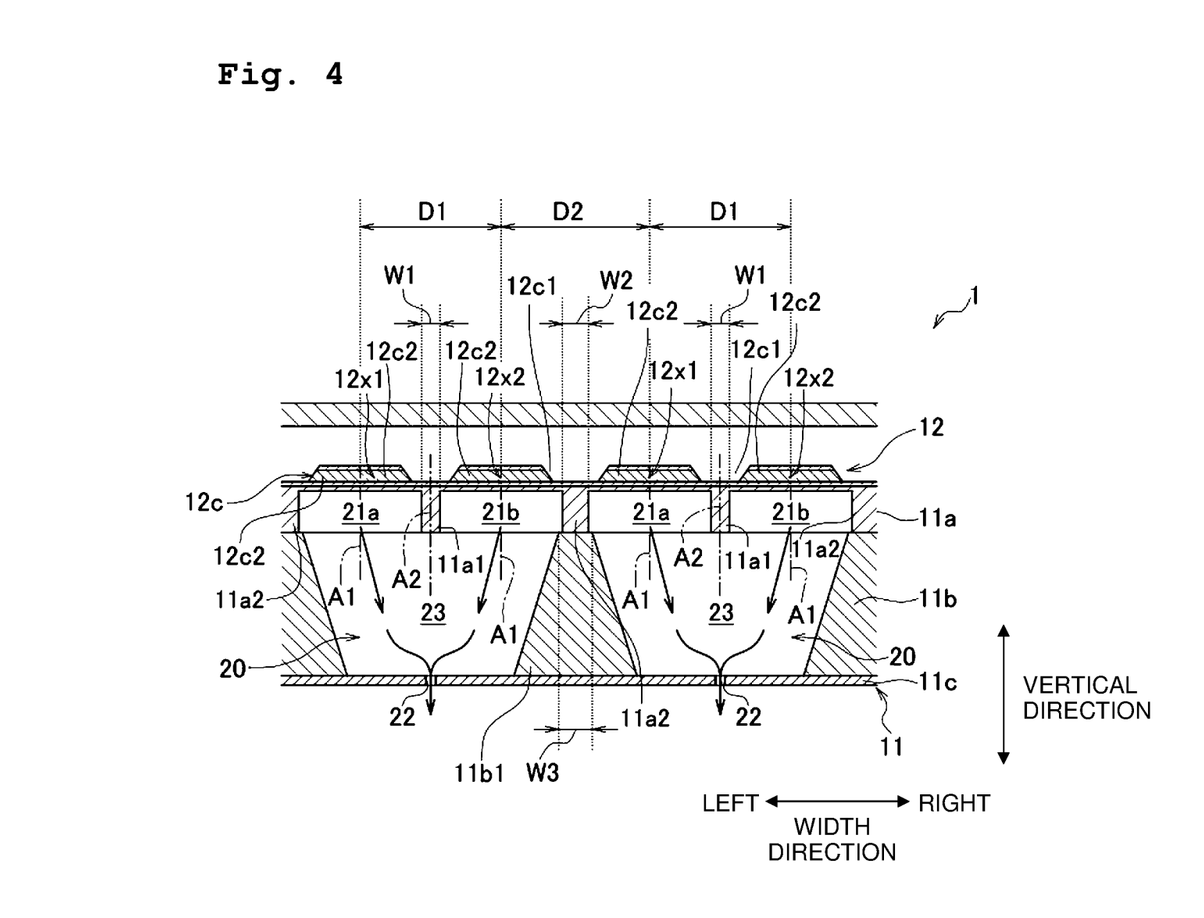
FIG. 4 is a cross-sectional view of the ink-jet head taken along a line IV-IV in FIG. 2.
Figure 5:
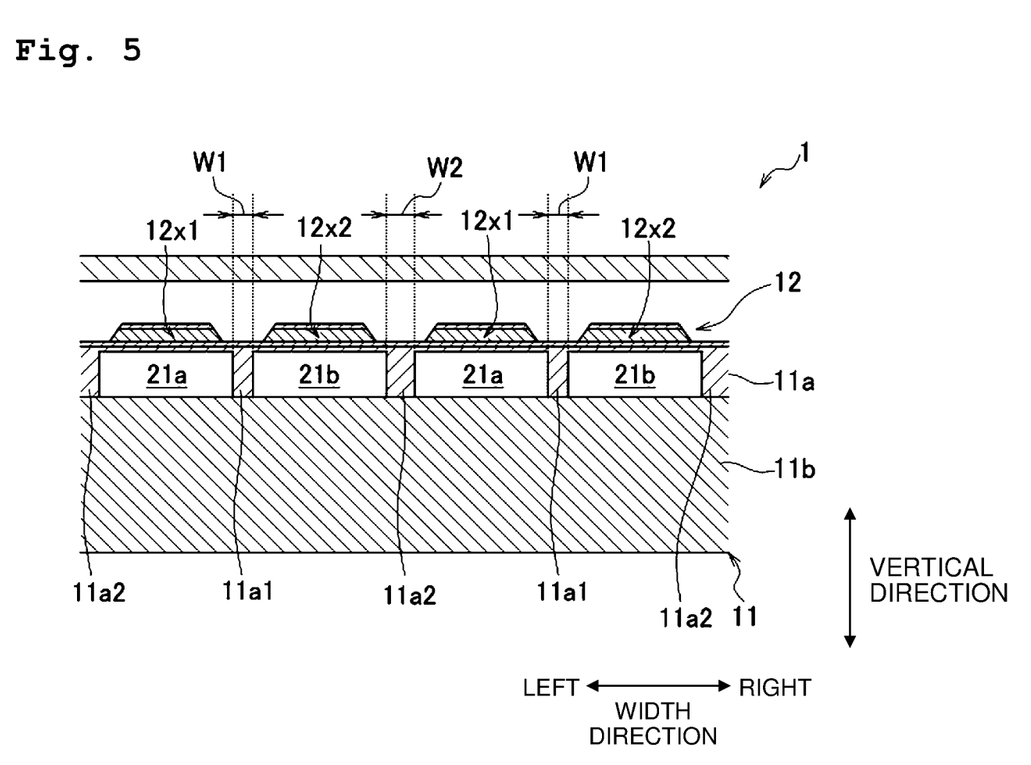
FIG. 5 is a cross-sectional view of the ink-jet head taken along a line V-V in FIG. 2.

As depicted in FIGS. 3 and 4, the communication channel 23 is formed by a through hole formed in the plate 11b ("communication channel member" of the present disclosure) by wet etching. The communication channel 23 extends in the vertical direction. The communication channel 23 has a tapered shape in which its length in the width direction is shorter toward the lower side in the vertical direction. An upper end of the communication channel 23 is connected to the first pressure chamber 21a and the second pressure chamber 21b. A lower end of the communication channel 23 is connected to the nozzle 22. Thus, in each individual channel 20, the first pressure chamber 21a, the second pressure chamber 21b, and the nozzle 22 communicate with each other via the communication channel 23.

Each part of the plate 11b between the communication channels 23 adjacent to each other in the width direction is a third partition wall 11b1 that separates the communication channels 23 from each other. An upper surface of the third partition wall 11b1 is joined to a lower surface of the second partition wall 11a2. As described above, the communication channel 23 has the tapered shape in which the length in the width direction is shorter toward the lower side in the vertical direction. Thus, a width (length in the width direction) of the third partition wall 11b1 is smaller toward the upper side in the vertical direction. In this configuration, the upper surface of the third partition wall 11b1 has the smallest width. A width W3 of the upper surface of the third partition wall 11b1 is larger than the width W2 of the second partition wall 11a2. The width W3 is, for example, approximately 25 µm.

As depicted in FIG. 3, the piezoelectric actuator 12 is disposed on an upper surface of the plate 11a. The piezoelectric actuator 12 includes a vibration film 12a, a common electrode 12b, a piezoelectric layer 12c, and individual electrodes 12d1 and 12d2. The vibration film 12a, the common electrode 12b, the piezoelectric layer 12c, and the individual electrodes 12d1 and 12d2 are stacked in this order from below. The shape of the piezoelectric actuator 12 as viewed in the vertical direction is the same as the shape of the plate 11a as viewed in the vertical direction. In the following explanation, the shape of a member as viewed in the vertical direction is referred to as an external form of the member. In this embodiment, the external form of the plate 11a overlaps completely with the external form of the piezoelectric actuator 12 in the vertical direction.

The vibration film 12a is formed by an upper end of the plate 11a. The vibration film 12a covers all the pressure chambers 21a and 21b. The common electrode 12b is disposed over an entire area of the upper surface of the plate 11a to cover all the pressure chambers 21a and 21b formed in the plate 11a. The vibration film 12a has, for example, a thickness of approximately 10 µm. The common electrode 12b has, for example, a thickness of approximately 0.2 µm.

The piezoelectric layer 12c is disposed above the vibration film 12a and the common electrode 12b. The piezoelectric layer 12c has, for example, a thickness of approximately 1 µm. In the piezoelectric layer 12c, slits 12c1 are formed in parts overlapping in the vertical direction with the second partition walls 11a1 and 11a2, a part positioned between the individual channel row 20A and the individual channel row 20B in the conveyance direction, and the like. In this configuration, the piezoelectric layer 12c is divided into piezoelectric bodies 12c2 corresponding to the respective pressure chambers 21. Each of the piezoelectric bodies 12c2 overlaps in the vertical direction with the corresponding one of the pressure chambers 21.

The individual electrodes 12d1 overlap in the vertical direction with the first pressure chambers 21a. The individual electrodes 12d2 overlap in the vertical direction with the second pressure chambers 21b. The individual electrodes 12d1 and 12d2 have, for example, a thickness of approximately 0.2 µm.

The piezoelectric actuator 12 further includes an insulating film 12i and traces 12e.

The insulating film 12i is formed, for example, by silicon dioxide ($SiO_2$). The insulating film 12i covers parts included in an upper surface of the common electrode 12b and not provided with the piezoelectric bodies 12c2, side surfaces of the piezoelectric bodies 12c2, and upper surfaces of the individual electrodes 12d1 and 12d2. Through holes are provided in parts of the insulating film 12i overlapping in the vertical direction with the individual electrodes 12d1 and 12d2. The insulating film 12i has, for example, a thickness of approximately 0.1 µm.

Figure 6:
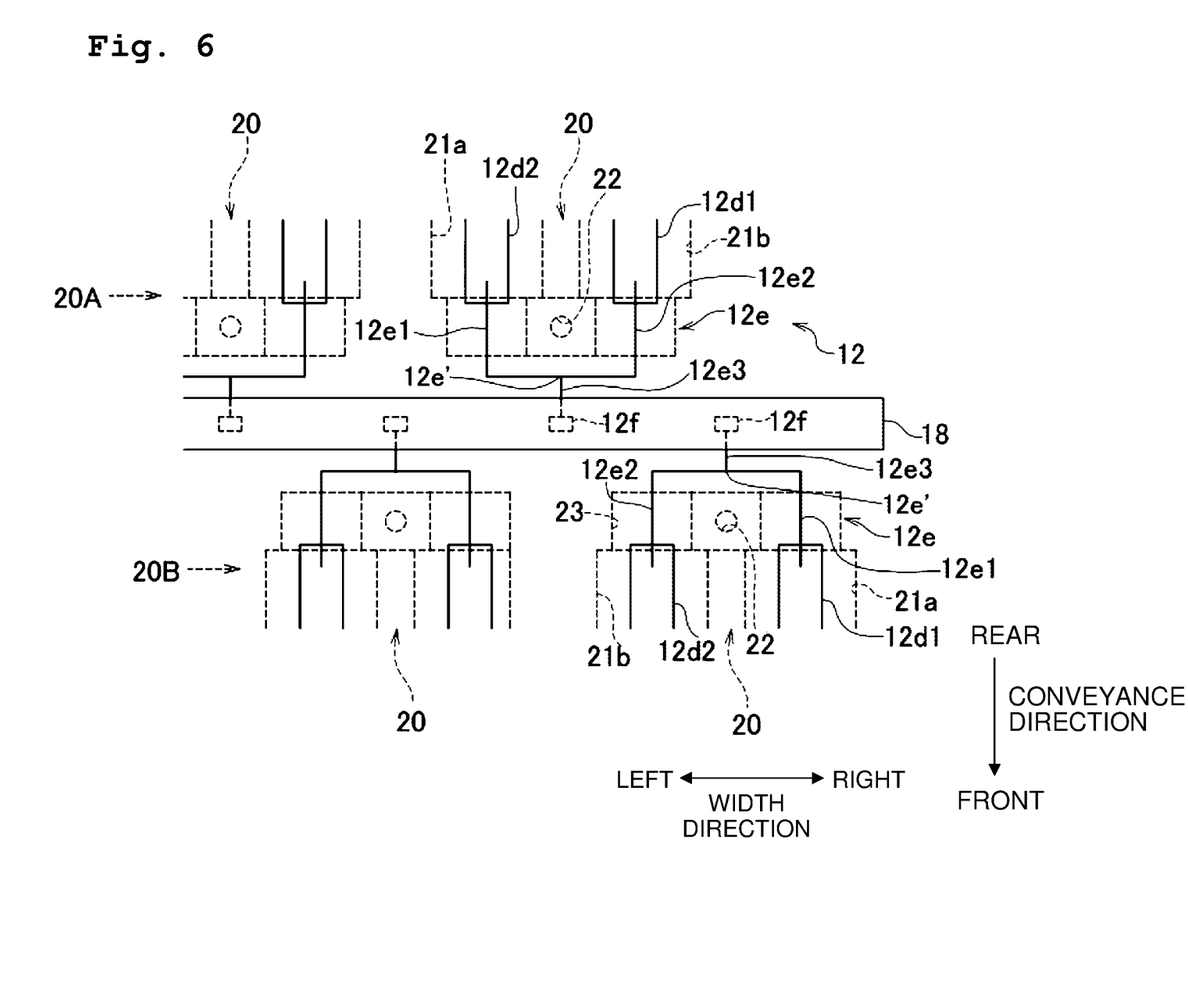
FIG. 6 is an enlarged view of an area VI depicted in FIG. 2.

The traces 12e are formed on the insulating film 12i. The traces 12e have, for example, a thickness of approximately 0.2 µm. As depicted in FIG. 6, the traces 12e correspond to the respective individual channels 20. The trace 12e has a first portion 12e1 having a L-shape and connected to the individual electrode 12d1, a second portion 12e2 having a L-shape and connected to the individual electrode 12d2 and the first portion 12e1, and a third portion 12e3 extending in the conveyance direction from a connection portion 12e' between the first portion 12e1 and the second portion 12e2. As depicted in FIG. 3, ends of the first portion 12e1 and the second portion 12e2 are inserted into the through holes of the insulating film 12i, so that the first portion 12e1 and the second portion 12e2 are electrically connected to the individual electrodes 12d1 and 12d2, respectively. The third portion 12e3 is pulled out in the conveyance direction to a part of the piezoelectric actuator 12 between the individual channel row 20A and the individual channel row 20B (between the pressure chamber row 19A and the pressure chamber row 19B) in the conveyance direction. An end of the third portion 12e3 is a contact 12f.

Parts of the piezoelectric actuator 12 that are disposed on the upper surface of the vibration film 11 and overlap in the vertical direction with the respective first pressure chambers 21a are piezoelectric elements 12x1. Parts of the piezoelectric actuator 12 that are disposed on the upper surface of the vibration film 11 and overlap in the vertical direction with the respective second pressure chambers 21b are piezoelectric elements 12x2.

Each of the piezoelectric elements 12x1 and 12x2 is arranged to have a symmetric shape in the width direction with respect to a center of the corresponding one of the pressure chambers 21. That is, each of the piezoelectric elements 12x1 and 12x2 passes through the center in the width direction of the corresponding one of the pressure chambers 21 and arranged symmetrically with respect to an axis A1 parallel to the vertical direction.

On the other hand, as described above, the width W2 of the second partition wall 11a2 is larger than the width W1 of the first partition wall 11a1. Thus, in this embodiment, an interval D2 between the piezoelectric element 12x1 and the piezoelectric element 12x2 adjacent to the second side in the width direction of the piezoelectric element 12x1 is larger than an interval D1 between the piezoelectric element 12x1 and the piezoelectric element 12x2 adjacent to the first side in the width direction of the piezoelectric element 12x1.

Since the piezoelectric elements 12x1 and 12x2 are arranged described above, the piezoelectric elements 12x1 and 12x2 corresponding to a certain individual channel 20 are symmetrical with respect to a midpoint between a center of the first pressure chamber 21a and a center of the second pressure chamber 21b in the width direction. That is, the piezoelectric elements 12x1 and 12x2 corresponding to a certain individual channel 20 are arranged symmetrically with respect to an axis A2 passing through the above midpoint and parallel to the vertical direction.

In this embodiment, the two individual electrodes 12d1 and 12d2 corresponding to one of the individual channels 20 are electrically connected to each other. Thus, the electrical potential of the two individual electrodes 12d1 and 12d2 corresponding to one of the individual channels 20 changes in a similar manner That is, the same driving signal is applied to the piezoelectric elements 12x1 and 12x2.

As depicted in FIG. 3, the protective member 13 adheres to an upper surface of the piezoelectric actuator 12. The protective member 13 is formed having two recesses 13x and a through hole 13y.

The two recesses 13x respectively correspond to the two individual channel rows 20A and 20B. Each of the recesses 13x accommodates the piezoelectric elements 12x1 and 12x2 corresponding to one of the individual channel rows 20A and 20B.

The through hole 13y is formed in a center portion in the conveyance direction of the protective member 13. The through hole 13y extends in the width direction over the contacts 12f to overlap in the vertical direction with the contacts 12f.

The manifold substrate 14 is disposed on an upper surface of a stacking body formed by the channel unit 11, the piezoelectric actuator 12, and the protective member 13. A lower surface of the manifold substrate 14 is formed having a recess 14a. The recess 14a extends over a substantially entire area of the manifold substrate 14 in the width direction and the conveyance direction. The plate 11b extends toward both sides in the conveyance direction beyond the plate 11a. Walls 14b defining both ends in the conveyance direction of the recess 14a of the manifold substrate 14 adhere to both ends in the conveyance direction of an upper surface of the plate 11b. The plate 11a, the piezoelectric actuator 12, and the protective member 13 are accommodated in the recess 14a, and an upper surface of the protective member 13 is joined to a ceiling surface 14a1 of the recess 14a.

The manifolds 31 and 32 are formed by disposing the manifold substrate 14 on the upper surface of the stacking body, which is formed by the channel unit 11, the piezoelectric actuator 12, and the protective member 13. The manifold 31 is defined by end surfaces at the rear side in the conveyance direction of the plate 11a, the piezoelectric actuator 12, and the protective member 13, the upper surface of the plate 11b, the ceiling surface 14a1, an end surface at the rear side in the conveyance direction of the recess 14a, and both end surfaces in the width direction of the recess 14a. The manifold 31 extends in the width direction. The manifold 31 is connected to the wide channels 25 forming the individual channel row 20A.

The manifold 32 is defined by end surfaces at the front side in the conveyance direction of the plate 11a, the piezoelectric actuator 12, and the protective member 13, the upper surface of the plate 11b, the ceiling surface 14a1, an end surface at the front side in the conveyance direction of the recess 14a, and end surfaces at both sides in the width direction of the recess 14a. The manifold 32 extends in the width direction. The manifold 32 is connected to the wide channels 25 forming the individual channel row 20B.

The manifolds 31 and 32 communicate with a subtank (not depicted) via supply openings 31x and 32x formed at an upper end of the manifold substrate 14. The subtank communicates with a main tank storing ink. The subtank stores ink supplied from the main tank. Ink in the subtank flows into the manifolds 31 and 32 from the supply openings 31x and 32x. Ink flowing into the manifold 31 is supplied to the respective individual channels 20 forming the individual channel row 20A. Ink flowing into the manifold 32 is supplied to the respective individual channels 20 forming the individual channel row 20B.

A part of the manifold substrate 14 overlapping in the vertical direction with the through hole 13y of the protective member 13 is formed having a through hole 14y. The contacts 12f are exposed through the through holes 13y and 14y.

The trace substrate 18 is, for example, a Chip On Film (COF). A lower end of the trace substrate 18 is joined to a center portion in the conveyance direction of the upper surface of the piezoelectric actuator 12. The lower end of the trace substrate 18 extends in the width direction (see FIGS. 2 and 6) on the upper surface of the piezoelectric actuator 12. The trace substrate 18 includes individual traces 18e (see FIG. 3) electrically connected to the respective contacts 12f and a common trace (not depicted). The individual traces 18e correspond to the respective individual channels 20. The common trace is electrically connected to the common electrode 12b via a through hole provided for the insulating film 12i. The common electrode 12b is connected to a power source (not depicted) via the common trace and kept at a ground potential.

As depicted in FIG. 3, the trace substrate 18 extends upward from the upper surface of the piezoelectric actuator 12 through the through holes 13y and 14y. An upper end of the trace substrate 18 is connected to a control substrate (not depicted). The driver IC 19 is mounted on the trace substrate 18.

The driver IC 19 is electrically connected to the individual electrodes 12d1 and 12d2 via the individual traces 18e. The driver IC 19 generates a driving signal based on a control signal from the control substrate (not depicted) and applies the driving signal to the individual electrodes 12d1 and 12d2. This switches the electrical potential of the individual electrodes 12d1 and 12d2 between a predefined driving potential and the ground potential. This deforms parts included in the vibration film 12a and the piezoelectric bodies 12c2 and overlapping in the vertical direction with the pressure chambers 21a and 21b, thus changing the volume of the pressure chambers 21a and 21b. Pressure is thus applied to ink in the pressure chambers 21a and 21b, and ink is discharged from the nozzles 22.

In FIG. 6, illustration of the protective member 13 is omitted.

Effects of This Embodiment

In this embodiment, when ink is discharged from a certain nozzle 22, the piezoelectric elements 12x1 and 12x2 corresponding to two pressure chambers (the first pressure chamber 21a and the second pressure chamber 21b) that communicate with the certain nozzle 22 are driven at the same time. This makes it possible to apply sufficient discharge energy to ink.

Further, in this embodiment, the rigidity of the second partition wall 11a2 that separates the first pressure chamber 21a from the second pressure chamber 21b adjacent to the second side in the width direction of the first pressure chamber 21a (the second pressure chamber 21b not communicating with the same nozzle 22) is higher than the rigidity of the first partition wall 11a1 that separates the first pressure chamber 21a from the second pressure chamber 21b adjacent to the first side in the width direction of the first pressure chamber 21a (the second pressure chamber 21b communicating with the same nozzle 22). In this configuration, the second partition wall 11a2 with high rigidity inhibits the deformation of the parts of the vibration film 12a overlapping in the vertical direction with the first pressure chamber 21a and the second pressure chamber 21b that communicate with the same nozzle 22 from being transmitted to a part of the vibration film 12a overlapping in the vertical direction with another pressure chamber 21 not communicating with said same nozzle 22. As a result, the crosstalk can be inhibited. The piezoelectric elements 12x1 and 12x2 corresponding to the first pressure chamber 21a and the second pressure chamber 21b that communicate with the same nozzle 22 are driven at the same time. In this situation, the deformation of the parts of the vibration film 12a overlapping in the vertical direction with the first pressure chamber 21a and the second pressure chamber 21b is not likely to be obstructed by the first partition wall 11a1 with low rigidity.

In this embodiment, the width W2 of the second partition walls 11a2 is larger than the width W1 of the first partition walls 11a1. This makes the rigidity of the second partition walls 11a2 higher than the rigidity of the first partition walls 11a1.

In this embodiment, the piezoelectric element 12x1 and the piezoelectric element 12x2 corresponding to a certain individual channel 20 are arranged in the width direction symmetrically with respect to the midpoint between the center of the first pressure chamber 21a and the center of the second pressure chamber 21b. Thus, pressure can be applied uniformly to the ink in the first pressure chamber 21a and the second pressure chamber 21b that communicate with the same nozzle 22, and discharge characteristics of ink discharged from the nozzle 22 can be stabilized.

In this embodiment, each of the piezoelectric elements 12x1 and 12x2 is arranged to have a symmetric shape in the width direction with respect to the center of the corresponding one of the pressure chambers 21. This allows each of the piezoelectric elements 12x1 and 12x2 to apply pressure to the ink in the corresponding one of the pressure chambers 21 most efficiently.

In this embodiment, the width W3 of the third partition walls 11b1 is larger than the width W2 of the second partition walls 11a2. Thus, even when the plate 11a is slightly shifted from the plate 11b in the width direction at the time of joining the plates 11a and 11b, the communication channel 23 is inhibited from communicating with the pressure chamber 21 not corresponding thereto.

In this embodiment, the width W1 of the first partition walls 11a1 is small. However, since the pressure chambers 21 are formed in the plate 11a by wet etching, the first partition walls 11a1 having the small width are formed with high accuracy.

The embodiment of the present disclosure is explained above. The present disclosure is not limited to the above embodiment. Various changes or modifications in the embodiment may be made. Modified embodiments of the embodiment are described below. The modified embodiments described below can be combined as appropriate.

First Modified Embodiment

In the above embodiment, each of the piezoelectric elements 12x1 and 12x2 is arranged to have a symmetric shape with respect to the axis A1, and the interval D2 is larger than the interval D1. The present disclosure, however, is not limited to these aspects.

Figure 7:
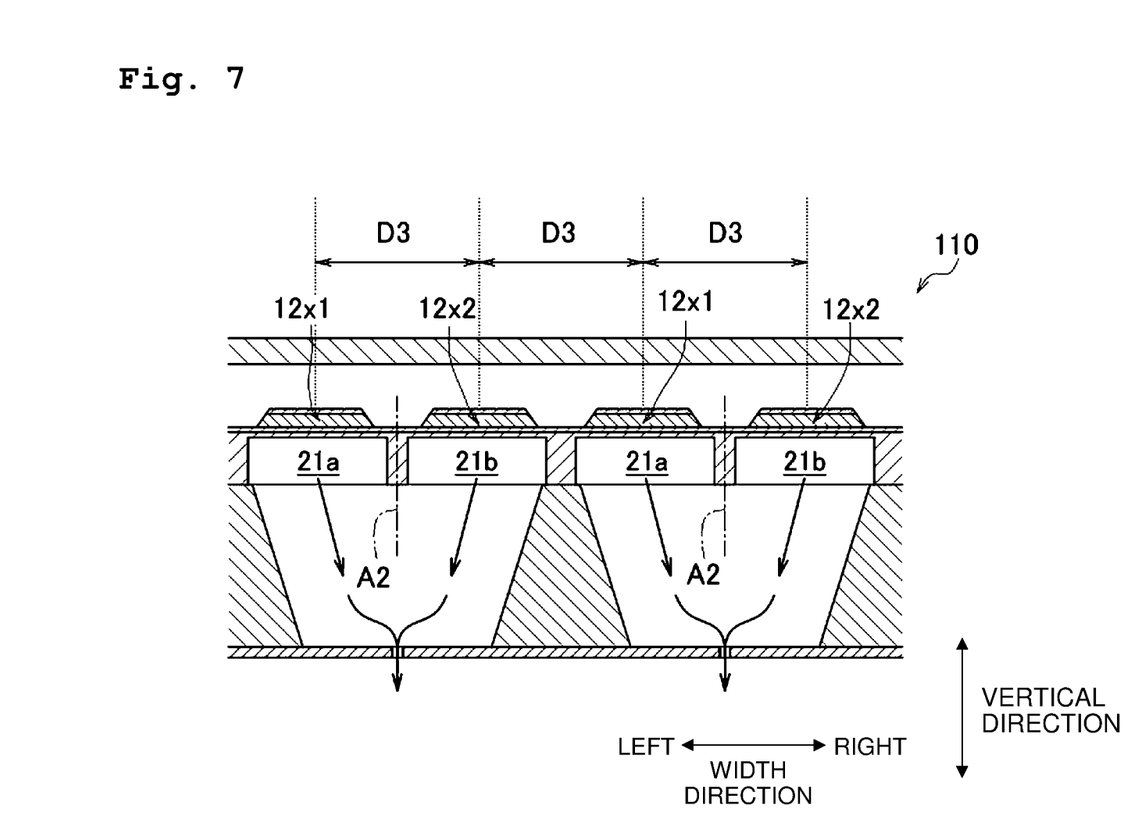
FIG. 7 is a cross-sectional view that corresponds to FIG. 4, depicting an ink-jet head according to a first modified embodiment.

For example, in an ink-jet head 110 according to a first modified embodiment as depicted in FIG. 7, an interval between the piezoelectric elements 12x1 and 12x2 corresponding to the individual channel row 20A is the same as an interval between the piezoelectric elements 12x1 and 12x2 corresponding to the individual channel row 20B (i.e., an interval D3). In this configuration, the piezoelectric element 12x1 is shifted from the center of the first pressure chamber 21a corresponding thereto in the width direction such that the piezoelectric element 12x1 is positioned at the second side in the width direction of the first pressure chamber 21a corresponding thereto. Further, the piezoelectric element 12x2 is shifted from the center of the second pressure chamber 21b corresponding thereto in the width direction such that the piezoelectric element 12x2 is positioned at the first side in the width direction of the first pressure chamber 21b corresponding thereto. In the first modified embodiment, the degree of the above shift in the piezoelectric element 12x1 is the same as that in the piezoelectric element 12x2. Thus, also in the first modified embodiment, the piezoelectric elements 12x1 and 12x2 corresponding to a certain individual channel 20 are arranged symmetrically with respect to the axis A2.

In the first modified embodiment, the piezoelectric elements 12x1 and 12x2 are arranged at regular intervals in the width direction. Thus, when the piezoelectric elements 12x1 and 12x2 are formed by film formation, film formation failure is not likely to be caused.

As described above, the piezoelectric elements 12x1 and 12x2 corresponding to a certain individual channel 20 are arranged symmetrically with respect to the axis A2 in the first modified embodiment. The aspects of the present disclosure, however, are not limited thereto. When all the intervals between the piezoelectric elements 12x1 and 12x2 are the same, the piezoelectric elements 12x1 and 12x2 corresponding to a certain individual channel 20 may not be arranged symmetrically with respect to the axis A2. For example, all the piezoelectric elements 12x1 and 12x1 may be arranged such that they are shifted from the positions in the first modified embodiment toward the same side in the width direction by the same length.

In the above embodiment, the width W3 of the third partition walls 11b1 is larger than the width W2 of the second partition walls 11a2. The aspects of the present disclosure, however, are not limited thereto. The width W3 of the third partition walls 11b1 may be the same as the width W2 of the second partition walls 11a2. The width W3 of the third partition walls 11b1 may be smaller than the width W2 of the second partition walls 11a2.

The piezoelectric elements 12x1 and 12x2 corresponding to a certain individual channel 20 may be arranged at positions that are symmetrically with respect to the axis A2 and that are different from the above embodiment and the first modified embodiment.

In the above embodiment, the channels such as the pressure chambers 21 are formed in the plate 11a by wet etching. The aspects of the present disclosure, however, are not limited thereto. For example, the channels such as the pressure chambers 21 may be formed in the plate 11a by dry etching.

Second Modified Embodiment

In the above embodiment, the piezoelectric layer 12c is divided into the piezoelectric bodies 12c2 corresponding to the respective pressure chambers 21 by forming the slits 12c1 in the parts of the piezoelectric layer 12c overlapping in the vertical direction with the first partition walls 11a1 and in the parts of the piezoelectric layer 12c overlapping in the vertical direction with the second partition walls 11a2. The aspects of the present disclosure, however, are not limited thereto.

Figure 8:
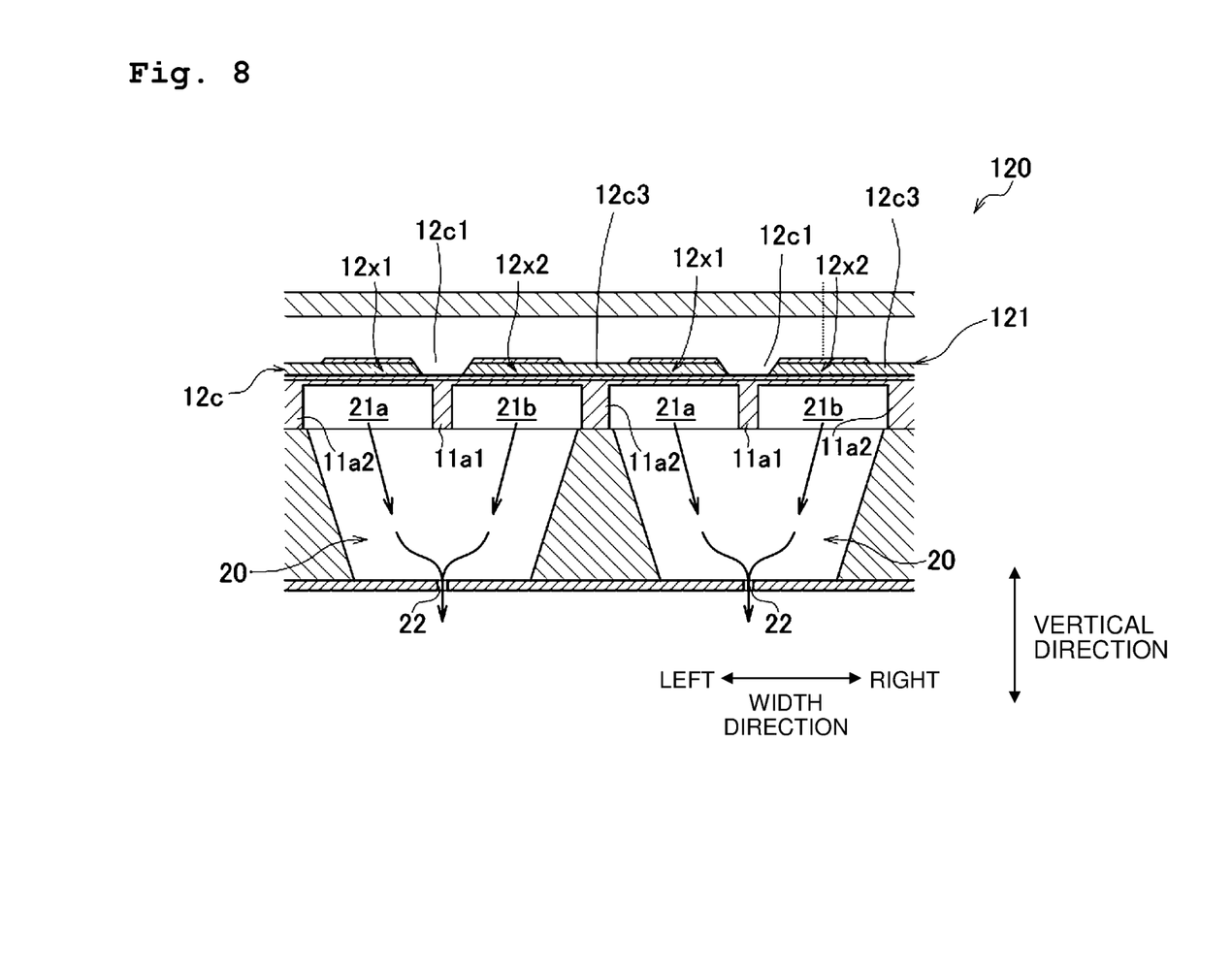
FIG. 8 is a cross-sectional view that corresponds to FIG. 3, depicting an ink-jet head according to a second modified embodiment.

For example, in an ink-jet head 120 according to a second modified embodiment as depicted in FIG. 8, the slits 12c1 are formed in parts of the piezoelectric layer 12c overlapping in the vertical direction with the first partition walls 11a1, but no slits are formed in parts of the piezoelectric layer 12c overlapping in the vertical direction with the second partition walls 11a2. In this configuration, the piezoelectric layer 12c is divided into piezoelectric bodies 12c3 each of which extends in the width direction over the first pressure chamber 21a and the second pressure chamber 21b adjacent to the second side in the width direction of the first pressure chambers 21a.

In a piezoelectric actuator 121 of the ink-jet head 120 according to the second modified embodiment, the slit 12c1 is formed in each part of the piezoelectric layer 12c between the first pressure chamber 21a and the second pressure chamber 21b adjacent to the first side in the width direction of the first pressure chamber 21a (the second pressure chamber 21b communicating with the same nozzle 22). Thus, when the two piezoelectric elements 12x1 and 12x2 corresponding to the two pressure chambers 21a and 21b are driven, the deformation of parts of the vibration film 12a overlapping in the vertical direction with the pressure chambers 21a and 21b is not likely to be obstructed by the piezoelectric layer 12c.

On the other hand, no slit 12c1 is formed in each part of the piezoelectric layer 12c between the first pressure chamber 21a and the second pressure chamber 21b adjacent to the second side in the width direction of the first pressure chamber 21a (the second pressure chamber 21b not communicating with the same nozzle 22). Thus, a thickness of said each part of the piezoelectric actuator 121 between the two pressure chambers 21 is large, which makes the rigidity of said each part high. In this configuration, the deformation of parts of the piezoelectric actuator 121 overlapping in the vertical direction with the first pressure chamber 21a and the second pressure chamber 21b that form a certain individual channel 20 is not likely to be transmitted to parts of the piezoelectric actuator 121 overlapping in the vertical direction with the first pressure chamber 21a and the second pressure chamber 21b that form another individual channel 20. As a result, the crosstalk can be inhibited effectively.

Further, in the above embodiment, the width W2 of the second partition walls 11a2 is larger than the width W1 of the first partition walls 11a1. This makes the rigidity of the second partition walls 11a2 higher than that of the first partition walls 11a1. The aspects of the present disclosure, however, are not limited thereto. For example, the width W1 may be the same as the width W2, and the second partition walls 11a2 may be formed from a material of which rigidity is higher than the first partition walls 11a1.

Further, the aspects of the present disclosure are not limited to that the rigidity of the second partition walls 11a2 is higher than that of the first partition walls 11a1. For example, the rigidity of the second partition walls 11a2 may be lower than the rigidity of the first partition walls 11a1. In this case, the second partition walls 11a2 are made to have appropriate rigidity. Thus, when the piezoelectric elements 12x1 and 12x2 corresponding to a certain individual channel 20 are driven, the deformation of the parts of the vibration film 12a overlapping in the vertical direction with the pressure chambers 21 that form the certain individual channel 20 is not likely to be transmitted to the parts of the vibration film 12a overlapping in the vertical direction with the pressure chambers 21 that form another individual channel 20. That is, the second partition wall 11a2 is deformed to absorb the deformation of the parts of the vibration film 12a overlapping in the vertical direction with the pressure chambers 21 that form the certain individual channel 20. As a result, the crosstalk can be inhibited effectively.

Third Modified Embodiment

Figure 9:
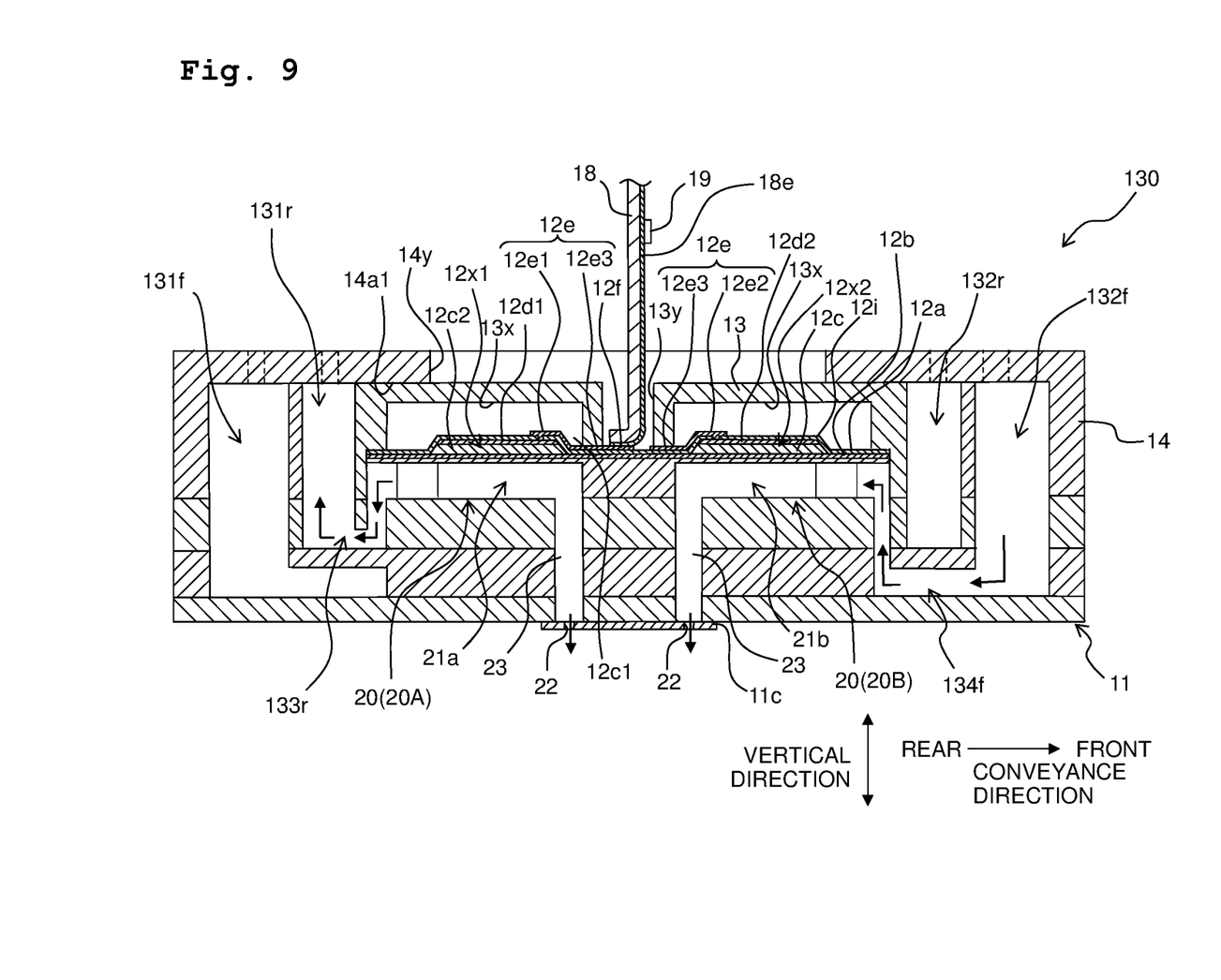
FIG. 9 is a cross-sectional view that corresponds to FIG. 3, depicting a circulation-type ink-jet head.

The present disclosure is applicable to a circulation-type liquid discharge head. Referring to FIG. 9, a circulation-type ink-jet head 130 according to a third modified embodiment is explained. The ink-jet head 130 has a similar structure as the ink-jet head 1, except that a supply manifold 131f and a return manifold 131r are provided instead of the manifold 31 and that a supply manifold 132f and a return manifold 132r are provided instead of the manifold 32. The constitutive parts or components, which are the same as or equivalent to those of the ink-jet head 1, are designated by the same reference numerals, any explanation therefor is omitted.

As depicted in FIG. 9, the supply manifold 131f and the return manifold 131r are arranged in the conveyance direction. Similarly, the supply manifold 132f and the return manifold 132r are arranged in the conveyance direction. The supply manifold 132f communicates with the pressure chamber 21b via a supply channel 134f. The supply channel 134f extends rearward in the conveyance direction from a lower side of the supply manifold 132f, and then extends upward to communicate with the pressure chamber 21b. Although not depicted in FIG. 9, the supply manifold 131f communicates with the pressure chamber 21b via a supply channel similar to the supply channel 134f.

As depicted in FIG. 9, the return manifold 131r communicates with the pressure chamber 21a via a return channel 133r. The return channel 133r extends frontward in the conveyance direction from a lower side of the supply manifold 131r, and then extends upward to communicate with the pressure chamber 21a. Although not depicted in FIG. 9, the return manifold 132r communicates with the pressure chamber 21a via a return channel similar to the return channel 133r.

Ink in the supply manifold 132f flows through the supply channel 134f and is supplied to the pressure chamber 21b. Ink supplied to the pressure chamber 21b flows to the communication channel 23 and part of the ink is discharged from the nozzle 22. Ink not discharged from the nozzle 22 flows toward the pressure chamber 21a communicating with the same communication channel 23. Ink in the pressure chamber 21a flows to the return manifold 132r via a return channel (not depicted). Accordingly, ink supplied from the supply manifold 132f flows to the return manifold 132r after flowing through the pressure chamber 21b and the pressure chamber 21a.

Similarly, ink in the supply manifold 131f flows through a supply channel (not depicted) and is supplied to the pressure chamber 21b. Ink supplied to the pressure chamber 21b flows to the communication channel 23 and part of the ink is discharged from the nozzle 22. Ink not discharged from the nozzle 22 flows toward the pressure chamber 21a communicating with the same communication channel 23. Ink in the pressure chamber 21a flows to the return manifold 131r via the return channel 133r. Accordingly, ink supplied from the supply manifold 131f flows to the return manifold 131r after flowing through the pressure chamber 21b and the pressure chamber 21a.

The flowing of ink from each of the supply manifolds 131f and 132f to the corresponding one of the return manifolds 131r and 132r is caused as described above. This inhibits ink in the vicinity of the nozzle 22 from staying there for a long time, thereby making it possible to inhibit the increase in viscosity of ink in the vicinity of the nozzle 22.

The above explanation is made about the examples in which the present disclosure is applied to the line head. The present disclosure, however, is not limited thereto. The present disclosure may be applied to a so-called serial head that is carried on a carriage and that discharges ink from nozzles while moving together with the carriage.

The present disclosure can be applied to any other apparatus than the ink-jet head configured to discharge ink from nozzles. For example, the present disclosure can be applied to a liquid discharge head configured to discharge any other liquid than ink.

What is claimed is:

1. A liquid discharge head, comprising:
   a channel unit including a liquid channel that includes a first pressure chamber pair of a first pressure chamber and a second pressure chamber, and a second pressure chamber pair of a third pressure chamber and a fourth pressure chamber;
   a vibration film disposed at a first side in a first direction of the channel unit to cover the first to fourth pressure chambers; and
   a first to a fourth piezoelectric elements disposed at the first side in the first direction of the vibration film, the first to fourth piezoelectric elements overlapping with the first to fourth pressure chambers in the first direction, respectively,
   wherein the first pressure chamber pair and the second pressure chamber pair are arranged in a second direction orthogonal to the first direction,
   wherein the channel unit further includes:
      first partition walls separating the first pressure chamber from the second pressure chamber in the second direction, and the third pressure chamber from the fourth pressure chamber in the second direction; and
      a second partition wall separating the second pressure chamber from the third pressure chamber in the second direction,
   wherein the liquid channel further includes:
      a first nozzle;
      a first communication channel connecting the first pressure chamber, the second pressure chamber and the first nozzle;
      a second nozzle;
      a second communication channel connecting the third pressure chamber, the fourth pressure chamber and the second nozzle;
   in the channel unit, rigidity of the first partition walls is different from rigidity of the second partition wall.

2. The liquid discharge head according to claim 1, wherein the rigidity of the second partition wall is higher than the rigidity of the first partition walls.

3. The liquid discharge head according to claim 2, wherein the second partition wall is longer in the second direction than the first partition walls.

4. The liquid discharge head according to claim 3, wherein the first piezoelectric elements and the second piezoelectric elements, are arranged in the second direction symmetrically with respect to a midpoint between a center of the first pressure chamber and a center of the second pressure chamber, and
   wherein the third piezoelectric elements and the fourth piezoelectric elements are arranged in the second direction symmetrically with respect to a midpoint between a center of the third pressure chamber and a center of the fourth pressure chamber.

5. The liquid discharge head according to claim 4, wherein each of the first to fourth piezoelectric elements is arranged to have a symmetric shape in the second direction with respect to a center of one of the first to fourth pressure chambers corresponding thereto.

6. The liquid discharge head according to claim 3, the first to fourth piezoelectric elements are arranged at a regular interval in the second direction.

7. The liquid discharge head according to claim 3, wherein the channel unit includes:
   a pressure chamber member formed having the first to fourth pressure chambers;
   a nozzle member formed having the first and second nozzles; and
   a communication channel member disposed between the pressure chamber member and the nozzle member in the first direction and formed having the first and second communication channels,
   wherein the second partition wall of the pressure chamber member is joined to a third partition wall of the communication channel member that separates the first communication channels and the second communication channel, and
   the third partition wall is longer in the second direction than the second partition wall.

8. The liquid discharge head according to claim 3, wherein the channel unit includes a pressure chamber member that has the pressure chambers formed by wet etching.

9. The liquid discharge head according to claim 1, wherein each of the first to fourth piezoelectric elements includes a piezoelectric layer disposed at the first side in the first direction of the vibration film and extending over the first to fourth pressure chambers,
   a part of the piezoelectric layer overlapping in the first direction with each of the first to fourth pressure chambers forms a part of each of the first to fourth piezoelectric elements,
   slits are formed at a part of the piezoelectric layer between the first pressure chamber and the second pressure chamber in the second direction between the third pressure chamber and the fourth pressure chamber in the second direction, respectively, and
   a slit is not formed at a part of the piezoelectric layer between the second pressure chamber and the third pressure chamber in the second direction.

* * * * *

UNITED STATES PATENT AND TRADEMARK OFFICE
CERTIFICATE OF CORRECTION

PATENT NO. : 11,485,138 B2
APPLICATION NO. : 17/232452
DATED : November 1, 2022
INVENTOR(S) : Taiki Tanaka It is certified that error appears in the above-identified patent and that said Letters Patent is hereby corrected as shown below:

In the Claims

Column 14, Claim 4, Lines 5-6:
Please delete "the first piezoelectric elements and the second piezoelectric elements, are" and insert --the first piezoelectric element and the second piezoelectric element are--

Column 14, Claim 4, Lines 10-11:
Please delete "the third piezoelectric elements and the fourth piezoelectric elements" and insert --the third piezoelectric element and the fourth piezoelectric element--

Column 14, Claim 7, Lines 35-36:
Please delete "the first communication channels" and insert --the first communication channel--

Column 14, Claim 9, Line 52:
Please delete "a part" and insert --parts--

Column 14, Claim 9, Line 54:
Please delete "direction between" and insert --direction and between--

Signed and Sealed this
Twenty-fifth Day of July, 2023

Katherine Kelly Vidal
*Director of the United States Patent and Trademark Office*